United States Patent
Rabjohn

(10) Patent No.: US 8,271,028 B2
(45) Date of Patent: Sep. 18, 2012

(54) DUAL BAND AMPLIFIER

(75) Inventor: Gordon G. Rabjohn, Ottawa (CA)

(73) Assignee: Sige Semiconductor Inc., Ottawa, Ontario (CA)

( * ) Notice: Subject to any disclaimer, the term of this patent is extended or adjusted under 35 U.S.C. 154(b) by 410 days.

(21) Appl. No.: 12/490,638

(22) Filed: Jun. 24, 2009

(65) Prior Publication Data
US 2009/0325527 A1    Dec. 31, 2009

Related U.S. Application Data

(60) Provisional application No. 61/129,443, filed on Jun. 26, 2008.

(51) Int. Cl.
*H04M 1/00* (2006.01)
*H04K 3/00* (2006.01)
(52) U.S. Cl. ............. 455/552.1; 333/124
(58) Field of Classification Search ......... 455/281, 455/303, 306, 552.1, 553.1; 333/112, 124, 333/126, 129
See application file for complete search history.

(56) References Cited

U.S. PATENT DOCUMENTS

| | | | |
|---|---|---|---|
| 6,992,545 B2* | 1/2006 | Spiegel et al. | 333/132 |
| 2006/0067254 A1* | 3/2006 | Mahbub et al. | 370/282 |
| 2006/0178122 A1* | 8/2006 | Srinivasan et al. | 455/168.1 |

* cited by examiner

*Primary Examiner* — Lee Nguyen
(74) *Attorney, Agent, or Firm* — Freedman & Associates

(57) ABSTRACT

A dual band amplifier is provided comprising a first matching circuit disposed in a first radiofrequency path between an input port and a first amplifier and a second matching circuit disposed in a second radiofrequency path between the input port and a second amplifier. The first matching circuit transforms a first input impedance of the first amplifier to a predetermined input port impedance when the radiofrequency signal is in a first frequency range and transmits the first input impedance to the input port when the radiofrequency signal is in the second frequency range. The second matching circuit transforms the second input impedance to the input port impedance when the input signal is in the second frequency range and transmits the second input impedance to the input port when the radiofrequency signal is in the first frequency range.

30 Claims, 9 Drawing Sheets

DUAL BAND AMPLIFIER

FIELD OF THE INVENTION

The instant invention relates to the field of communication systems and in particular to a dual band communication system comprising two single band amplifiers connected to a same input port.

BACKGROUND

Wireless Local Area Network (WiLAN) technology is becoming widely used in home and office applications. Using, for example, radio frequency technology, WiLAN systems provide wireless communication for minimizing or obviating the need for wired connections. Therefore, WiLAN systems are relatively simple to install and cost effective.

WiLAN systems commonly operate in two frequency ranges—frequency bands: 2.4 GHz-2.5 GHz and 4.9 GHz-5.9 GHz. Accordingly, there is a need in WiLAN receivers to amplify received radio frequency signals for both frequency bands.

A preferred solution for such a receiver is to provide a single antenna for receiving the radio frequency signals for both frequency bands and connect the same to two single band low noise amplifiers—one amplifier for each frequency band—to reduce complexity and cost.

Unfortunately, state of the art technology requires use of either a switch or a diplexer disposed between the antenna and the two low noise amplifiers in order to provide the received signal to the low noise amplifier corresponding to its frequency band. However, use of a switch or a diplexer substantially increases complexity and cost and, furthermore, introduces signal loss, thus degrading the noise figure.

It would be highly desirable to overcome at least some of the above-mentioned drawbacks.

SUMMARY OF EMBODIMENT OF THE INVENTION

In accordance with the present invention there is provided an electronic circuit comprising:
an input port for receiving a radiofrequency signal, the radiofrequency signal being in one of a first frequency range and a second frequency range, the first frequency range comprising frequencies higher than the frequencies of the second frequency range;
a first amplifier for generating a first output signal in dependence upon the radiofrequency signal when the radiofrequency signal is in the first frequency range, the first amplifier having a predetermined first input impedance;
a second amplifier for generating a second output signal in dependence upon the radiofrequency signal when the radiofrequency signal is in the second frequency range, the second amplifier having a predetermined second input impedance;
a first matching circuit disposed in a first radiofrequency path between the input port and the first amplifier, the first matching circuit for transmitting the first input impedance to the input port when the radiofrequency signal is in the second frequency range and for transforming the first input impedance to a predetermined input port impedance when the radiofrequency signal is in the first frequency range; and,
a second matching circuit disposed in a second radiofrequency path between the input port and the second amplifier, the second matching circuit for transmitting the second input impedance to the input port when the radiofrequency signal is in the first frequency range and for transforming the second input impedance to the input port impedance when the input signal is in the second frequency range.

In accordance with the present invention there is further provided an electronic circuit comprising:
an input port for receiving a radiofrequency signal, the radiofrequency signal being in one of a first frequency range and a second frequency range, the first frequency range comprising frequencies higher than the frequencies of the second frequency range;
a first amplifier transistor for generating a first output signal in dependence upon the radiofrequency signal when the radiofrequency signal is in the first frequency range, the first amplifier transistor having a first input impedance, the first input impedance being sufficient for reflecting the radiofrequency signal in the second frequency range;
a second amplifier transistor for generating a second output signal in dependence upon the radiofrequency signal when the radiofrequency signal is in the second frequency range, the second amplifier transistor having a second input impedance, the second input impedance being sufficient for reflecting the radiofrequency signal in the first frequency range;
a low pass filter disposed in a first radiofrequency path between the input port and a control terminal of the first amplifier transistor, the low pass filter having a predetermined first low pass filter reactance in the first frequency range for matching the first input impedance to a predetermined input port impedance and a predetermined second low pass filter reactance in the second frequency range for transmitting the first input impedance to the input port; and,
a high pass filter disposed in a second radiofrequency path between the input port and a control terminal of the second amplifier transistor, the high pass filter having a predetermined first high pass filter reactance in the first frequency range for transmitting the second input impedance to the input port and a predetermined second high pass filter reactance in the second frequency range for matching the second input impedance to the input port impedance.

In accordance with the present invention there is yet further provided storage medium having stored therein executable commands for execution on a processor, the executable commands for when executed resulting in an electronic circuit design comprising:
an input port for receiving a radiofrequency signal, the radiofrequency signal being in one of a first frequency range and a second frequency range, the first frequency range comprising frequencies higher than the frequencies of the second frequency range;
a first amplifier transistor for generating a first output signal in dependence upon the radiofrequency signal when the radiofrequency signal is in the first frequency range, the first amplifier transistor having a first input impedance, the first input impedance being sufficient for reflecting the radiofrequency signal in the second frequency range;
a second amplifier transistor for generating a second output signal in dependence upon the radiofrequency signal when the radiofrequency signal is in the second frequency range, the second amplifier transistor having a second input impedance, the second input impedance being sufficient for reflecting the radiofrequency signal in the first frequency range;
a low pass filter disposed in a first radiofrequency path between the input port and a control terminal of the first amplifier transistor, the low pass filter having a predetermined first low pass filter reactance in the first frequency range for matching the first input impedance to a predetermined input port impedance and a predetermined second low pass filter reactance in the second frequency range for transmitting the first input impedance to the input port; and, a high pass filter disposed in a second radiofrequency path between the input port and a control terminal of the second amplifier transistor, the high pass filter having a predetermined first high pass filter reactance in the first frequency range for transmitting the second input impedance to the input port and a predetermined second high pass filter reactance in the second frequency range for matching the second input impedance to the input port impedance.

In accordance with the present invention there is yet further provided a method comprising:

receiving a control signal indicative of a radiofrequency signal being in one of a first frequency range and a second frequency range;

turning ON one of a first amplifier and a second amplifier in dependence upon the control signal;

receiving the radiofrequency signal;

if the radiofrequency signal is in the first frequency range, transforming a predetermined first input impedance of the first amplifier to match a predetermined impedance of an input port for receiving the radiofrequency signal and transmitting a predetermined second input impedance of the second amplifier to the input port;

if the radiofrequency signal is in the second frequency range, transforming the second input impedance of the second amplifier to match the impedance of the input port and transmitting the first input impedance of the first amplifier to the input port; and, processing the radiofrequency signal using the turned ON one of the first amplifier and the second amplifier.

BRIEF DESCRIPTION OF THE FIGURES

Exemplary embodiments of the invention will now be described in conjunction with the following drawings, in which:

FIGS. 1 to 5 are simplified block diagrams illustrating dual band amplifiers according to embodiments of the invention; and, FIGS. 6 and 7 are simplified flow diagrams of methods of dual band amplification according to embodiments of the invention.

DETAILED DESCRIPTION OF EMBODIMENTS OF THE INVENTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

While embodiments of the invention will be described based on Field Effect Transistors (FETs) in E-mode for the sake of simplicity, it will become evident to those skilled in the art that the invention is not limited thereto, but is also implementable using, for example, FETs in D-mode or other types of transistors such as Bipolar Junction Transistors (BJTs). Furthermore, the embodiments of the invention are not limited to the frequency bands of WiLAN systems but are applicable for processing radiofrequency signals in any two non-overlapping radiofrequency ranges. For example, b/g at 2.4-2.5 GHz in a first frequency range and GPS at 1.575 GHz in a second frequency range.

Figure 1:
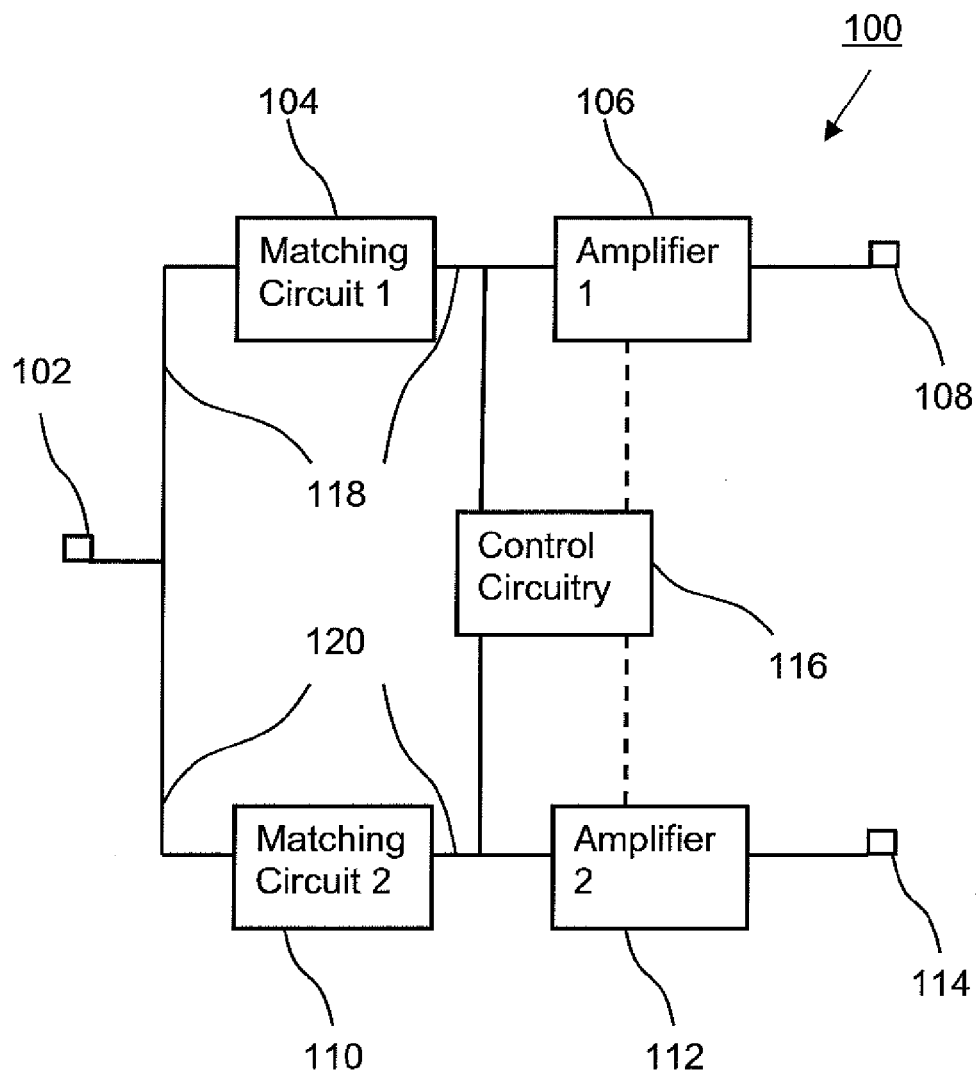
FIG. 1 is a simplified high level block diagram of an embodiment of the invention.

Referring to FIG. 1, a dual band amplifier 100 according to an embodiment of the invention is shown. The dual band amplifier 100 comprises an input port 102 for receiving a radiofrequency signal, for example, from an antenna of a WiLAN system. The radiofrequency signal is in one of a first frequency range and a second frequency range. The first frequency range comprises frequencies that are higher than the frequencies of the second frequency range. For example, the first frequency range corresponds to the 4.9 GHz-5.9 GHz band and the second frequency range corresponds to the 2.4 GHz-2.5 GHz band of the WiLAN system. A first amplifier 106, for example, a Low Noise Amplifier (LNA), generates a first output signal by amplifying the radiofrequency signal when the radiofrequency signal is in the first frequency range, which is then provided to output port 108. Optionally, the first amplifier 106 is operated to provide unity "amplification" or attenuation. A second amplifier 112, for example, a LNA, generates a second output signal by amplifying the radiofrequency signal when the radiofrequency signal is in the second frequency range, which is then provided to output port 114. Optionally, the second amplifier 112 is operated to provide unity "amplification" or attenuation.

Control circuitry 116 receives a control signal indicative of the radiofrequency signal being in the first frequency range or the second frequency range and "turns ON" the first amplifier 106 or the second amplifier 112 in dependence upon the control signal.

Provision of the radiofrequency signal received at the input port 102 to the first amplifier 106 or the second amplifier 112 is performed using a first matching circuit 104 disposed in a first radiofrequency path 118 between the input port 102 and the first amplifier 106; and a second matching circuit 110 disposed in a second radiofrequency path 120 between the input port 102 and the second amplifier 112.

The first matching circuit 104 transmits a predetermined first input impedance of the first amplifier 106 to the input port 102 when the radiofrequency signal is in the second frequency range and transforms the first input impedance to a predetermined input port impedance of the input port 102 when the radiofrequency signal is in the first frequency range. In a sense, the first matching circuit 104 has a frequency response such that it appears transparent in the second frequency range, thereby the first input impedance is presented at the input port 102. The first input impedance reflects the signal energy in the second frequency range and thereby forces most of the signal energy into the second radiofrequency path 120.

The second matching circuit 110 transmits a predetermined second input impedance of the second amplifier 112 to the input port 102 when the radiofrequency signal is in the first frequency range and transforms the second input impedance to the input port impedance of the input port 102 when the radiofrequency signal is in the second frequency range.

In a sense, the second matching circuit 110 has a frequency response such that it appears transparent in the first frequency range, thereby the second input impedance is presented at the input port 102. The second input impedance reflects the signal energy in the first frequency range and thereby forces most of the signal energy into the first radiofrequency path 118.

The first input impedance is determined such that the radiofrequency signal in the second frequency range is reflected. For example, the first input impedance is determined sufficiently large to reflect the radiofrequency signal in the second frequency range thus substantially preventing it from being absorbed in the first radiofrequency path 118. Alternatively, the first input impedance is determined sufficiently small to reflect the radiofrequency signal in the second frequency range 180° out of phase with the matching circuit 104 having a 180° phase shift.

The second input impedance is determined such that the radiofrequency signal in the first frequency range is reflected. For example, the second input impedance is determined sufficiently large to reflect the radiofrequency signal in the first frequency range thus substantially preventing it from being absorbed in the second radiofrequency path 120. Alternatively, the second input impedance is determined sufficiently small to reflect the radiofrequency signal in the first frequency range 180° out of phase with the matching circuit 110 having a 180° phase shift.

Figure 2:
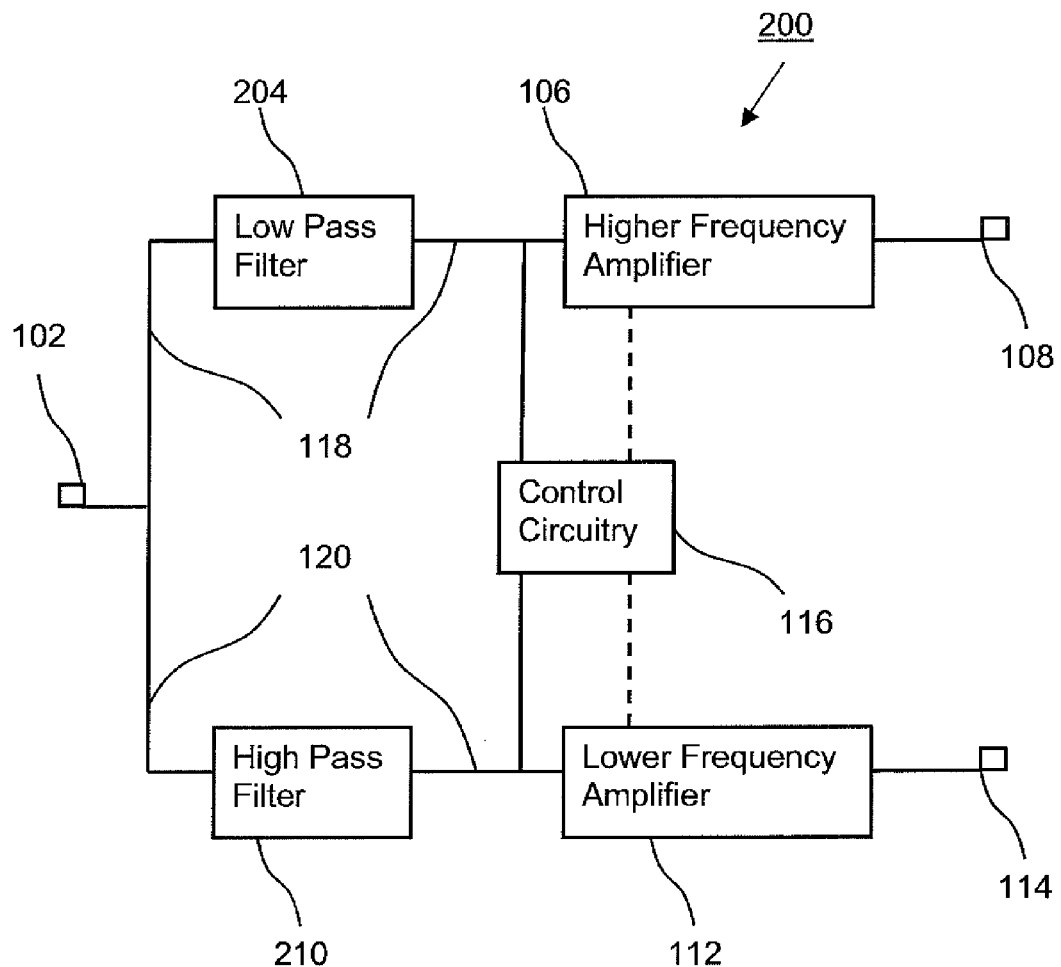
FIG. 2 is a simplified high level block diagram of an embodiment of the invention showing exemplary matching circuits.

The first matching circuit 104 and the second matching circuit 110 are realized, for example, by using a low pass filter in the first radiofrequency path 118 between the input port 102 and the first amplifier 106—higher frequency amplifier; and a high pass filter in the second radiofrequency path 120 between the input port 102 and the second amplifier 112—lower frequency amplifier, as shown in dual band amplifier 200 according to an embodiment of the invention illustrated in FIG. 2 with same reference numerals referring to same elements as in the dual band amplifier 100. The low pass filter 204 has a predetermined first low pass filter reactance in the first frequency range for matching the first input impedance to the input port impedance and a predetermined second low pass filter reactance in the second frequency range which is sufficiently small for transmitting the first input impedance to the input port. The high pass filter has a predetermined first high pass filter reactance in the first frequency range for transmitting the second input impedance to the input port and a predetermined second high pass filter reactance in the second frequency range for matching the second input impedance to the input port impedance.

Figure 3:
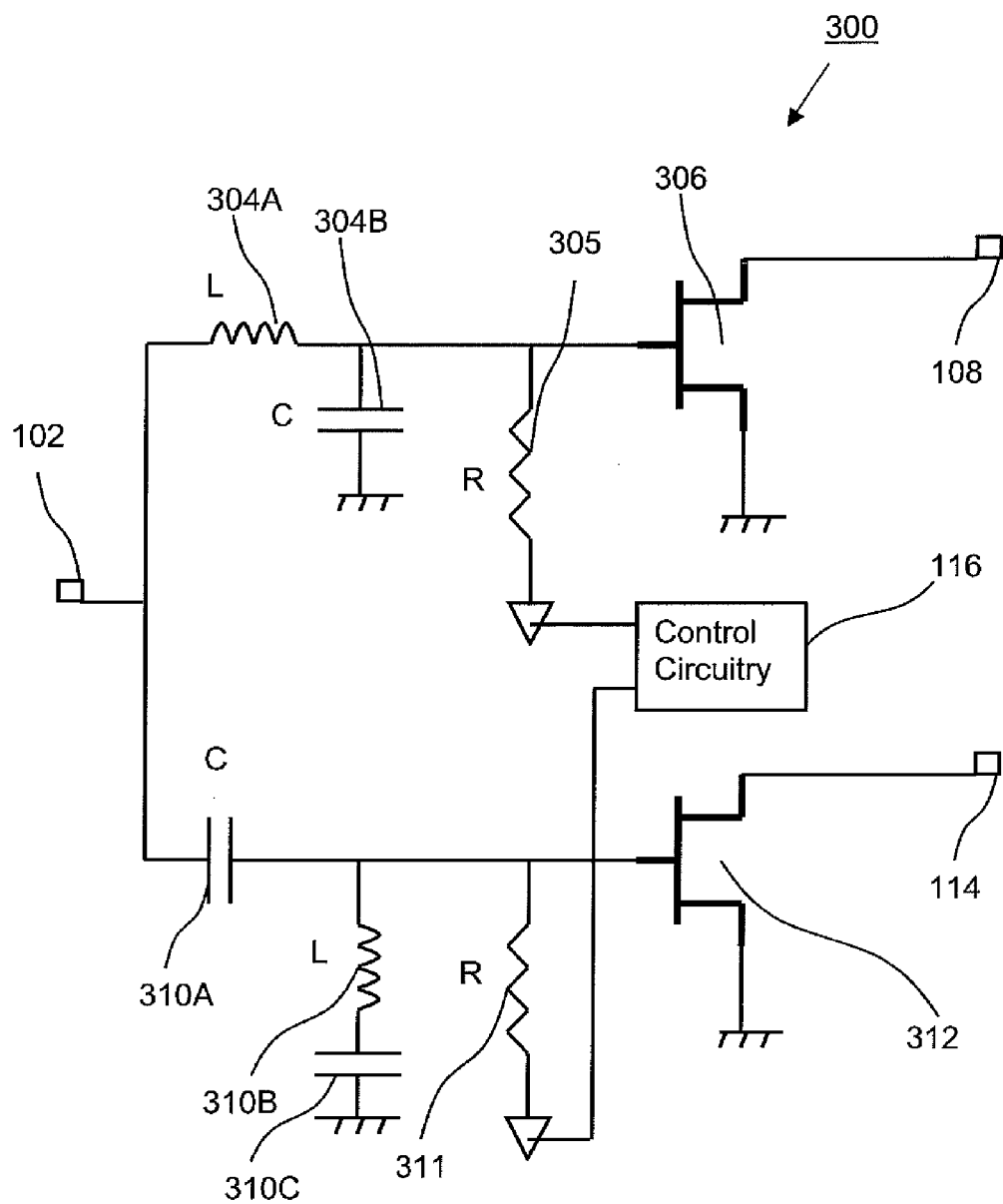
FIG. 3 is a simplified circuit diagram of an embodiment of the invention showing circuitry within the exemplary matching circuits.

The low pass filter comprises, for example, an inductor 304A disposed in the first radiofrequency path and a capacitor 304B connecting the first radiofrequency path to ground, as shown in dual band amplifier 300 according to an embodiment of the invention illustrated in FIG. 3 with same reference numerals referring to same elements as in the dual band amplifier 100. The high pass filter comprises a capacitor 310A disposed in the second radiofrequency path and an inductor 310B connecting the second radiofrequency path to ground via blocking capacitor 310C. As shown in FIG. 3, the first amplifier and the second amplifier comprise a first amplifier transistor 306 and a second amplifier transistor 312, respectively. The first radiofrequency path is connected to a control terminal of the first amplifier transistor 306 and the second radiofrequency path is connected to a control terminal of the second amplifier transistor 312. In the case of FETs used as amplifier transistors the control terminal is the gate of the transistor, as shown in FIG. 3. Optionally, when BJTs are used as amplifier transistors, the control terminal is the base of the transistor.

The control circuitry 116 switchably enables or "turns ON" the first amplifier transistor when the radiofrequency signal is in the first frequency range and switchably enables or "turns ON" the second amplifier transistor when the radiofrequency signal is in the second frequency range, for example, by controlling provision of a bias voltage via a high band gate bias circuit 305 connected to the first radiofrequency path and a low band gate bias circuit 311 connected to the second radiofrequency path. Optionally, when BJTs are used as amplifier transistors a bias current is provided to the base.

Figure 4:
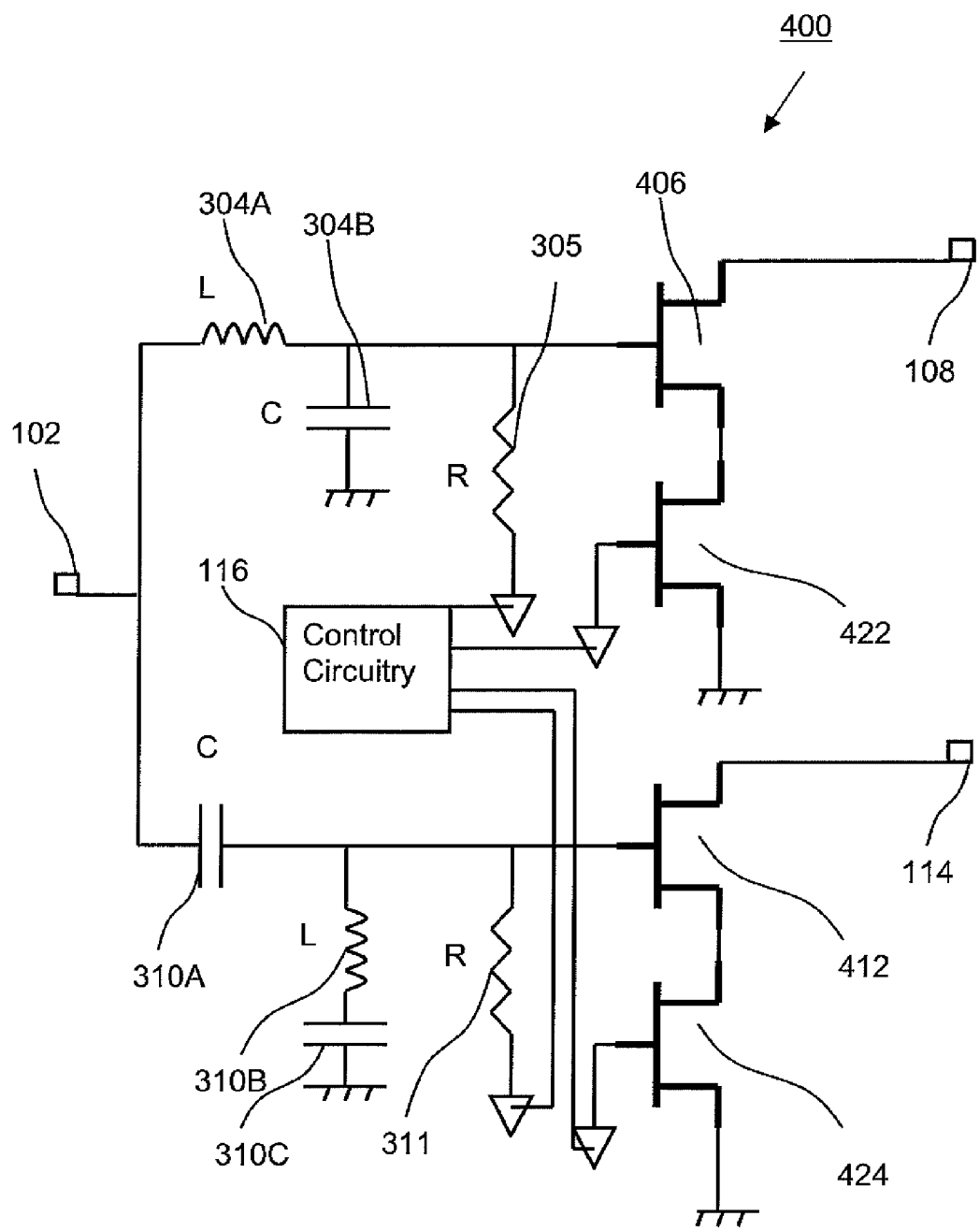
FIG. 4 is a simplified circuit diagram of an embodiment of the invention showing multi transistor amplifier circuits.

Referring to FIG. 4, dual band amplifier 400 according to an embodiment of the invention is shown, with same reference numerals referring to same elements as in the dual band amplifier 300. Here a source of the first amplifier transistor 406 and a source of the second amplifier transistor 412 are connected to a drain of a first source switch transistor 422 and a second source switch transistor 424, respectively, instead of being directly connected to ground as in the dual band amplifier 300. A gate of the first source switch transistor 422 and a gate of the second source switch transistor are connected to the control circuitry 116. The dual band amplifier 400 is capable of handling higher signal powers than the dual band amplifier 300, for example, when amplifiers 406 and 412 are isolated from RF power with transistors 422 and 424. Optionally, BJTs are used as source switch transistors instead of FETs as shown in FIG. 4.

Figure 5:
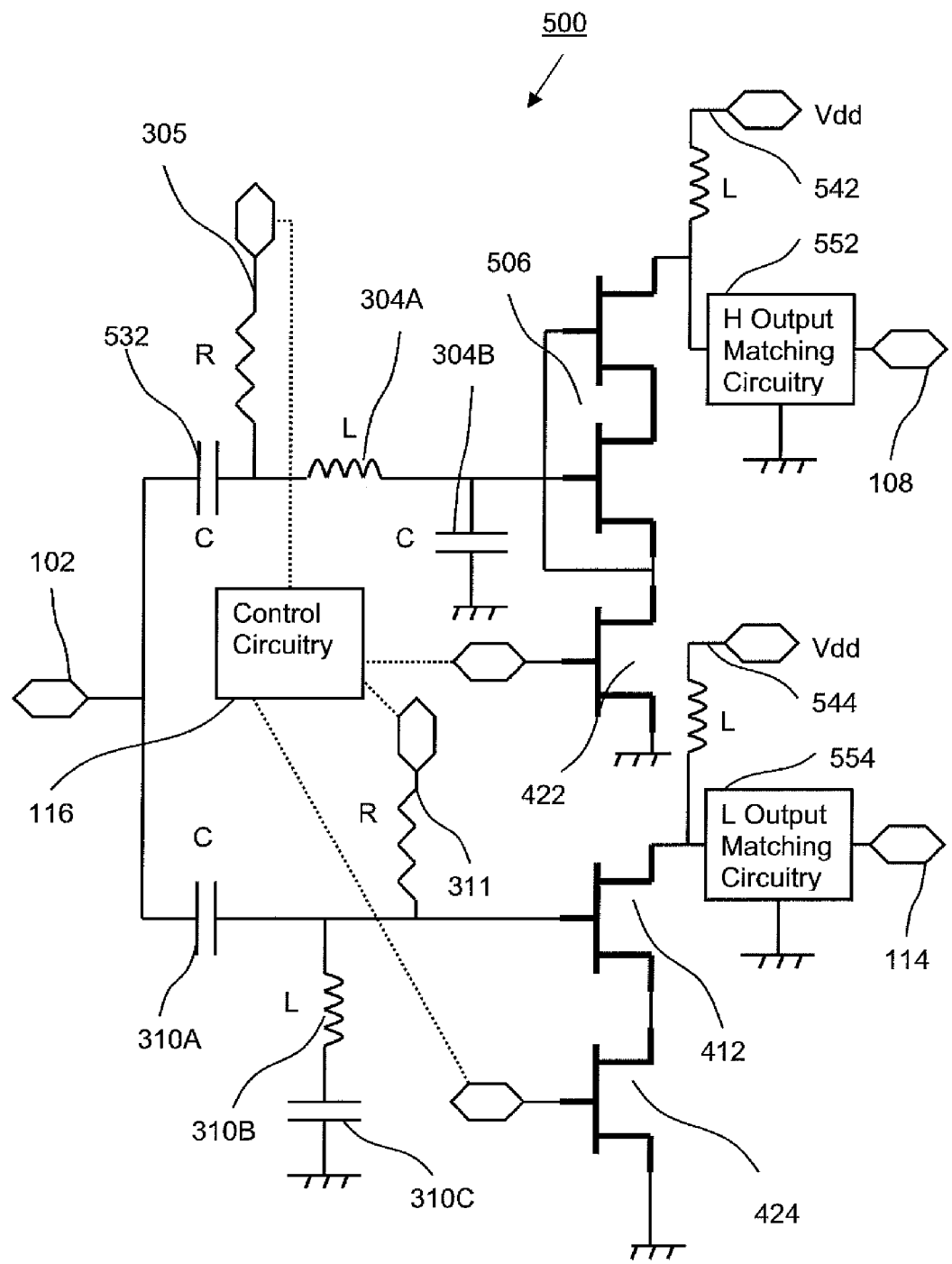
FIG. 5 is a simplified circuit diagram of an embodiment of the invention showing amplifiers in cascode arrangement.

Referring to FIG. 5, dual band amplifier 500 according to an embodiment of the invention is shown, with same reference numerals referring to same elements as in the dual band amplifier 400. The dual band amplifier 500 has been implemented for a WiLAN system operating in 4.9 GHz-5.9 GHz band and the 2.4 GHz-2.5 GHz band, but is not limited thereto. In FIG. 5 are also shown blocking capacitor 532, connection of the drain of the first amplifier transistor 506 and the drain of the second amplifier transistor 412 to a supply voltage circuit 542 and 544, respectively, and output matching circuitry 552 and 554, respectively. As shown in FIG. 5, the first amplifier transistor 506 comprises a cascode amplifier.

Optionally, the capacitor 304B is omitted, i.e. the capacitance 304B is provided by the gate capacitance of the amplifier FET.

The dual band amplifier according to embodiments of the invention is implemented, for example, on a single semiconductor chip—for example, as monolithic integration—using, for example, GaAs technology. The control circuitry, for example, a processor executing executable commands stored in memory or provided in a hardware implemented fashion is incorporated in the semiconductor chip or, alternatively, the semiconductor chip comprises ports for receiving control signals from a peripheral control system.

It is noted, that the input impedance of a transistor decreases with increasing size of same. However, in numerous applications, for example, application according to IEEE standard 802.11 the size of the transistors is sufficiently small to provide a sufficiently high input impedance for signal reflection as disclosed above.

Figure 6:
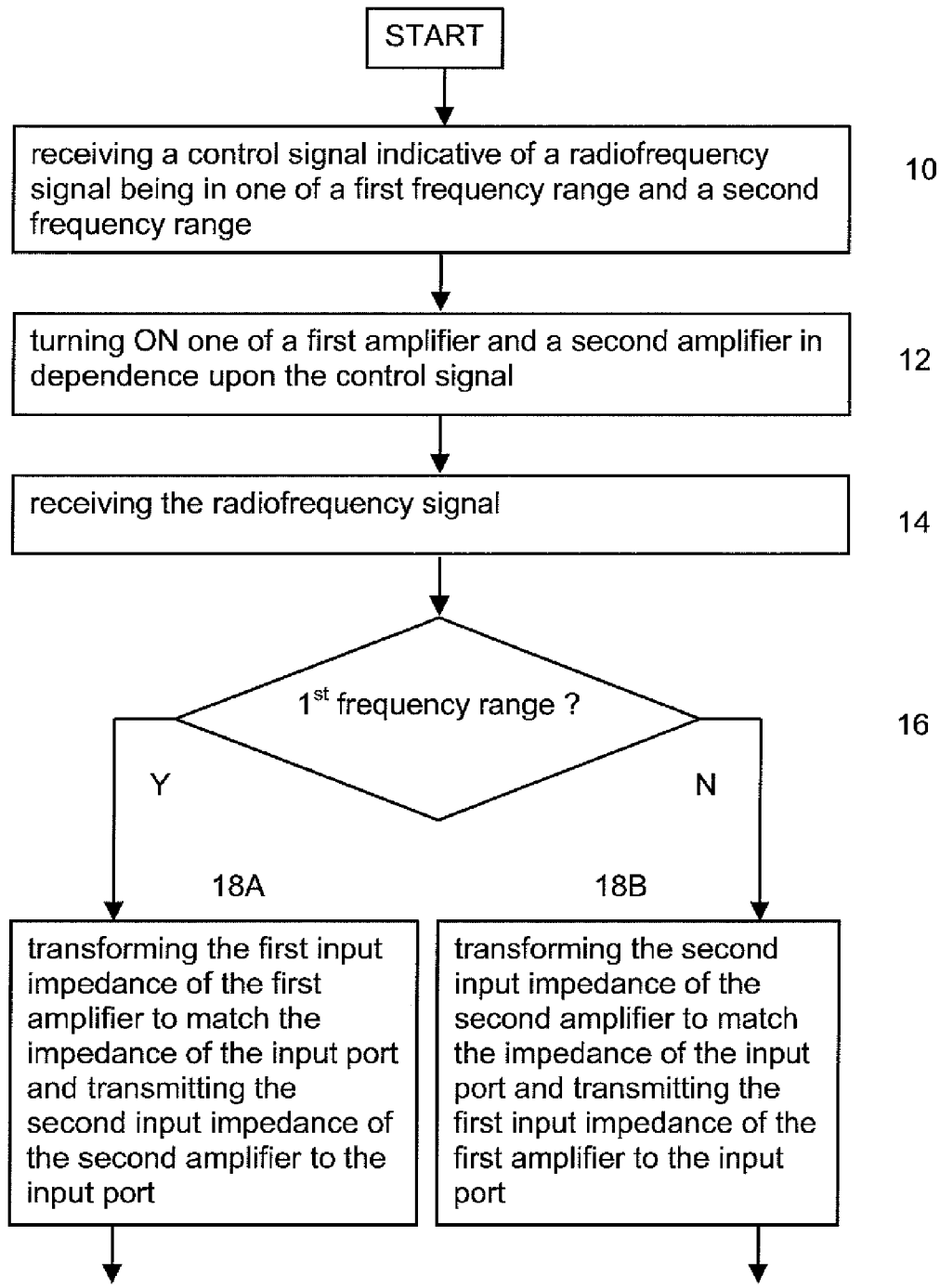
Figure 6:
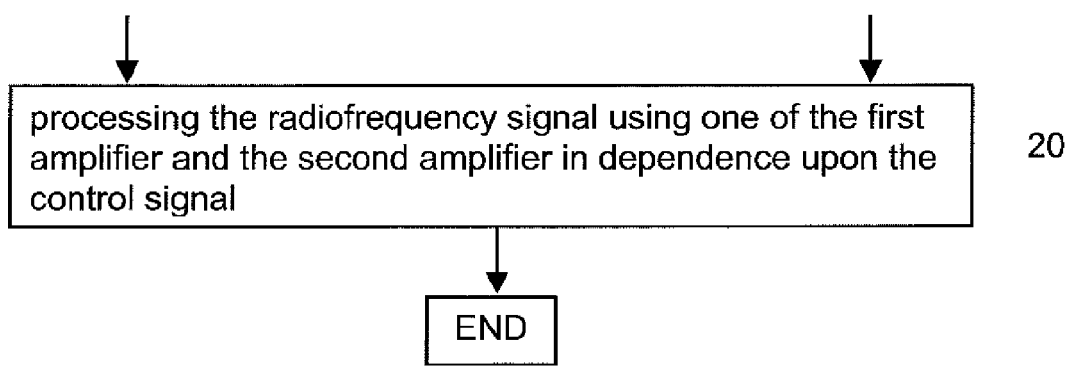

Referring to FIG. 6, a simplified flow diagram of a method of dual band amplification according to an embodiment of the invention is shown. At 10, a control signal indicative of a radiofrequency signal being in one of a first frequency range and a second frequency range is received, for example, at the control circuitry. The control circuitry then "turns ON" the first amplifier or the second amplifier in dependence upon the control signal—12. At 14, the radiofrequency signal is received.

If the radiofrequency signal is in the first frequency range—16—the first input impedance of the first amplifier is transformed to match the impedance of the input port and the second input impedance of the second amplifier is transmitted to the input port—18A.

If the radiofrequency signal is in the second frequency range—16—the second input impedance of the second amplifier is transformed to match the impedance of the input port and the first input impedance of the first amplifier is transmitted to the input port—18B.

The radiofrequency signal is then processed—20—using one of the first amplifier and the second amplifier in dependence upon the control signal, i.e. using the amplifier that has been "turned ON" at 12.

Figure 7:
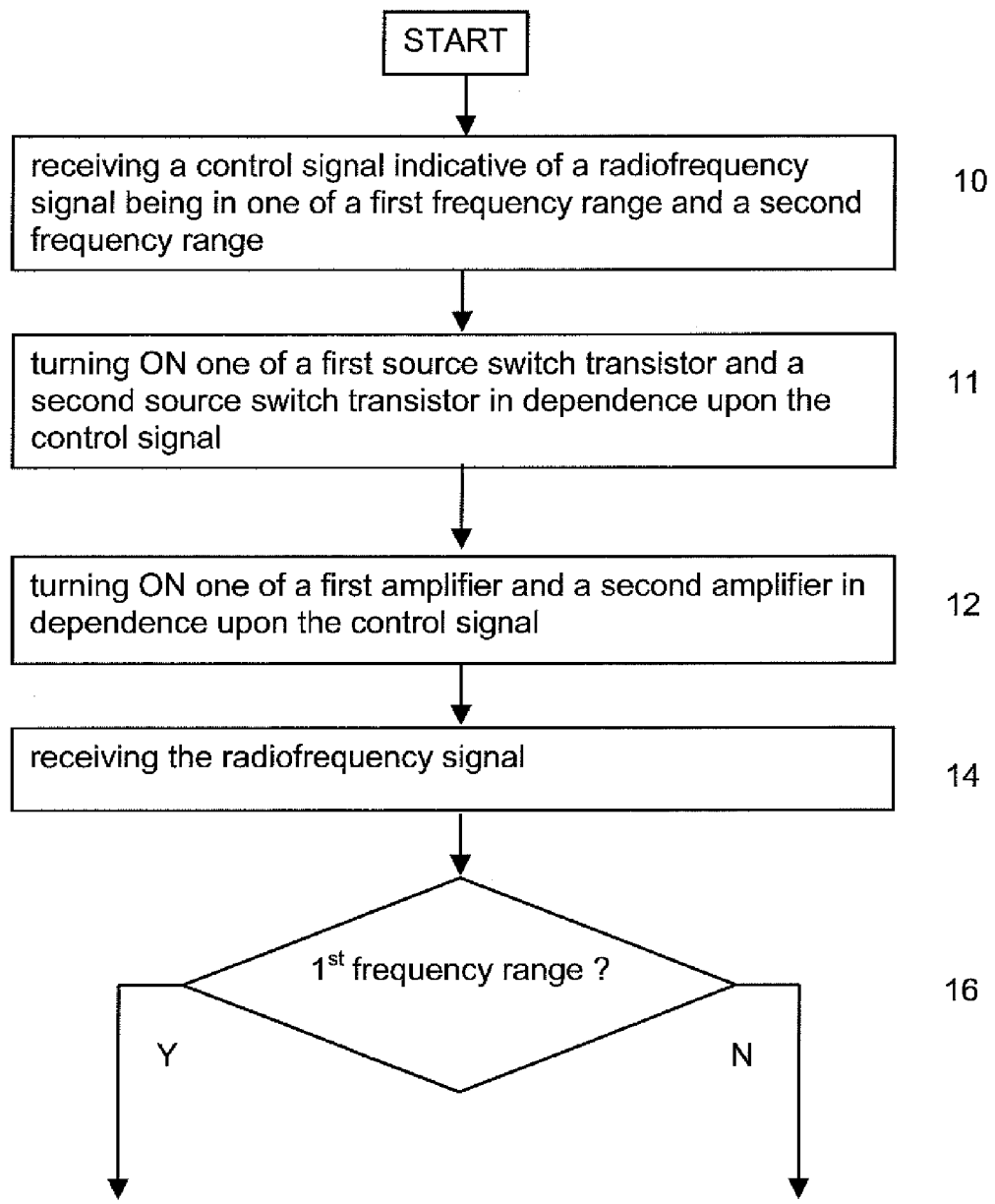
Figure 7:
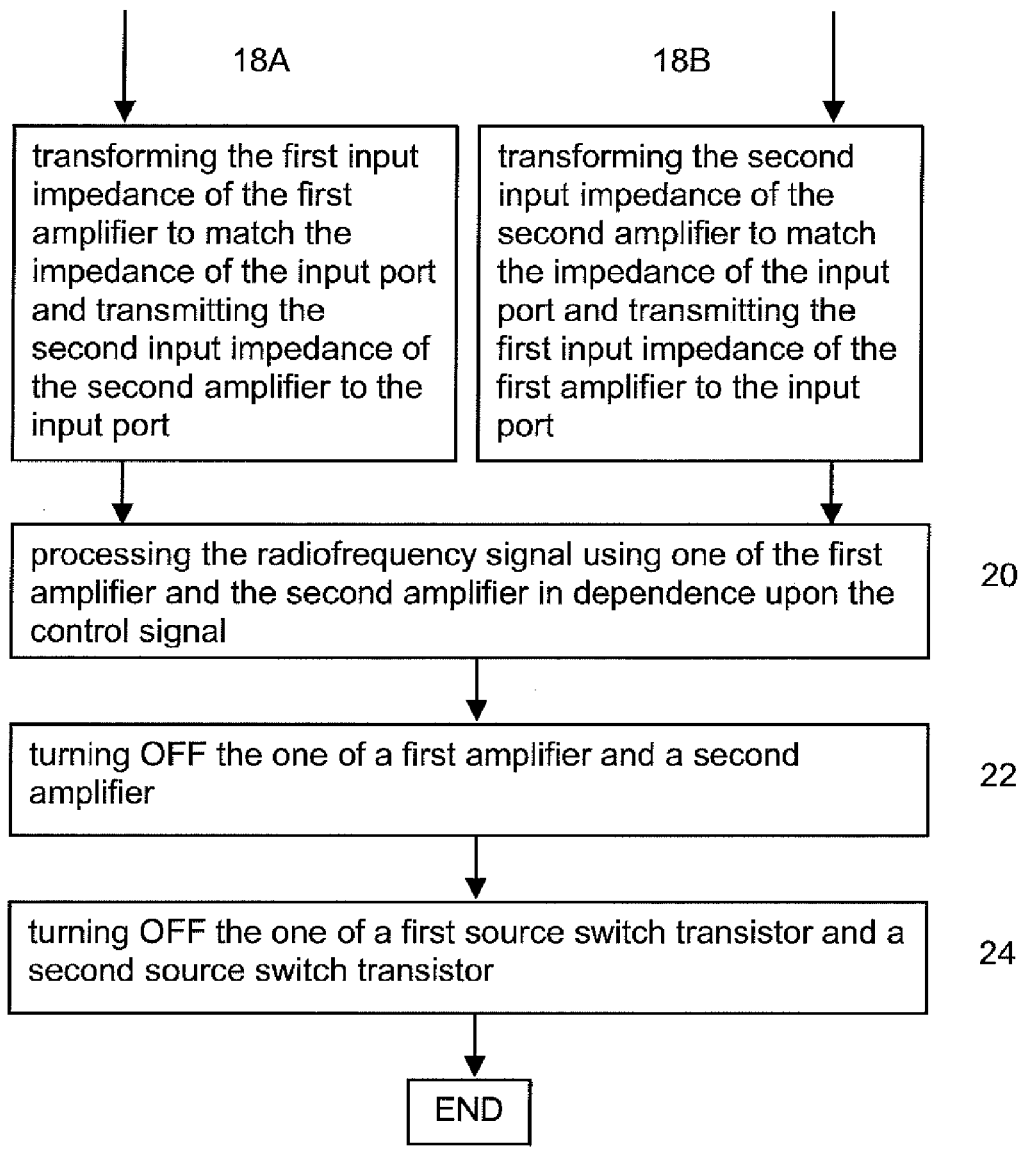

Referring to FIG. 7, a simplified flow diagram of a method of dual band amplification according to an embodiment of the invention is shown. Here the dual band amplifier comprises source switch transistors as illustrated, for example, in FIGS. 4 and 5. In order to avoid oscillations the corresponding source switch transistor is "turned ON"—11—before the amplifier is "turned ON" at 12. After processing of the radiofrequency signal the amplifier is "turned OFF"—22—before the source switch transistor is "turned OFF" at 24.

Knowing system requirements such as, for example, the frequency ranges of the radiofrequency signal, amplification factors of the first and the second amplifier, design of various embodiments of the dual band amplifier according to the invention is enabled using a processor executing commands based on the above description stored in a storage medium.

Numerous other embodiments of the invention will be apparent to persons skilled in the art without departing from the spirit and scope of the invention as defined in the appended claims.

What is claimed is:

1. An electronic circuit comprising:
   an input port for receiving a radiofrequency signal, the radiofrequency signal being in one of a first frequency range and a second frequency range, the first frequency range comprising frequencies higher than the frequencies of the second frequency range;
   a first amplifier for generating a first output signal in dependence upon the radiofrequency signal when the radiofrequency signal is in the first frequency range, the first amplifier having a predetermined first input impedance;
   a second amplifier for generating a second output signal in dependence upon the radiofrequency signal when the radiofrequency signal is in the second frequency range, the second amplifier having a predetermined second input impedance;
   a first matching circuit disposed in a first radiofrequency path between the input port and the first amplifier, the first matching circuit for transmitting the first input impedance to the input port when the radiofrequency signal is in the second frequency range and for transforming the first input impedance to a predetermined input port impedance when the radiofrequency signal is in the first frequency range; and,
   a second matching circuit disposed in a second radiofrequency path between the input port and the second amplifier, the second matching circuit for transmitting the second input impedance to the input port when the radiofrequency signal is in the first frequency range and for transforming the second input impedance to the input port impedance when the input signal is in the second frequency range.

2. An electronic circuit as defined in claim 1 wherein the first amplifier and the second amplifier are low noise amplifiers.

3. An electronic circuit as defined in claim 1 wherein the first input impedance is determined such that the radiofrequency signal in the second frequency range is reflected and wherein the second input impedance is determined such that the radiofrequency signal in the first frequency range is reflected.

4. An electronic circuit as defined in any one of claims 1 to 3 wherein the first matching circuit comprises a low pass filter and wherein the second matching circuit comprises a high pass filter.

5. An electronic circuit as defined in claim 4 wherein the low pass filter has a predetermined first low pass filter reactance in the first frequency range for matching the first input impedance to the input port impedance and a predetermined second low pass filter reactance in the second frequency range for transmitting the first input impedance to the input port and, the high pass filter has a predetermined first high pass filter reactance in the first frequency range for transmitting the second input impedance to the input port and a predetermined second high pass filter reactance in the second frequency range for matching the second input impedance to the input port impedance.

6. An electronic circuit as defined in claim 5 wherein the low pass filter includes an inductor disposed in the first radiofrequency path and a capacitor connecting the first radiofrequency path to ground and,
   wherein the high pass filter comprises a capacitor disposed in the second radiofrequency path and an inductor connecting the second radiofrequency path to ground.

7. An electronic circuit as defined in claim 6 wherein the low pass filter includes a first blocking capacitor disposed in the first radiofrequency path and, the high pass filter includes a second blocking capacitor disposed in series with the inductor.

8. An electronic circuit as defined in any one of claims 1 to 3 wherein the first amplifier and the second amplifier includes a first amplifier transistor and a second amplifier transistor, respectively.

9. An electronic circuit as defined in claim 8 wherein the first radiofrequency path is connected to a control terminal of the first amplifier transistor and the second radiofrequency path is connected to a control terminal of the second amplifier transistor.

10. An electronic circuit as defined in claim 9 wherein the control terminal of the first amplifier transistor and the control terminal of the second amplifier transistor is one of a gate of a field effect transistor and a base of a bipolar junction transistor.

11. An electronic circuit as defined in claim 9 further comprising control circuitry for switchably enabling the first amplifier transistor when the radiofrequency signal is in the first frequency range and for switchably enabling the second amplifier transistor when the radiofrequency signal is in the second frequency range.

12. An electronic circuit as defined in claim 11 wherein the control circuitry includes a high band gate bias circuit connected to the first radiofrequency path and a low band gate bias circuit connected to the second radiofrequency path.

13. An electronic circuit as defined in claim 12 wherein the control circuitry includes a first source switch transistor connected to a source of the first amplifier transistor and a second source switch transistor connected to a source of the second amplifier transistor.

14. An electronic circuit as defined in claim 8 wherein the first amplifier includes a cascade amplifier.

15. An electronic circuit as defined in claim 8 wherein the first amplifier transistor and the second amplifier transistor include a field effect transistor.

16. An electronic circuit as defined in claim 15 wherein the first source switch transistor and the second source switch transistor include a field effect transistor.

17. An electronic circuit comprising:
    an input port for receiving a radiofrequency signal, the radiofrequency signal being in one of a first frequency range and a second frequency range, the first frequency range comprising frequencies higher than the frequencies of the second frequency range;
    a first amplifier transistor for generating a first output signal in dependence upon the radiofrequency signal when the radiofrequency signal is in the first frequency range, the first amplifier transistor having a first input impedance, the first input impedance being sufficient for reflecting the radiofrequency signal in the second frequency range;
    a second amplifier transistor for generating a second output signal in dependence upon the radiofrequency signal when the radiofrequency signal is in the second frequency range, the second amplifier transistor having a second input impedance, the second input impedance being sufficient for reflecting the radiofrequency signal in the first frequency range;
    a low pass filter disposed in a first radiofrequency path between the input port and a control terminal of the first amplifier transistor, the low pass filter having a predetermined first low pass filter reactance in the first frequency range for matching the first input impedance to a predetermined input port impedance and a predetermined second low pass filter reactance in the second frequency range for transmitting the first input impedance to the input port; and,
    a high pass filter disposed in a second radiofrequency path between the input port and a control terminal of the second amplifier transistor, the high pass filter having a predetermined first high pass filter reactance in the first frequency range for transmitting the second input impedance to the input port and a predetermined second high pass filter reactance in the second frequency range for matching the second input impedance to the input port impedance.

18. An electronic circuit as defined in claim 17 wherein the control terminal of the first amplifier transistor and the control terminal of the second amplifier transistor is one of a gate of a field effect transistor and a base of a bipolar junction transistor.

19. An electronic circuit as defined in claim 17 further comprising control circuitry for switchably enabling the first amplifier transistor when the radiofrequency signal is in the first frequency range and for switchably enabling the second amplifier transistor when the radiofrequency signal is in the second frequency range.

20. An electronic circuit as defined in claim 19 wherein the control circuitry includes a high band gate bias circuit connected to the first radiofrequency path and a low band gate bias circuit connected to the second radiofrequency path.

21. An electronic circuit as defined in claim 20 wherein the control circuitry includes a first source switch transistor connected to a source of the first amplifier transistor and a second source switch transistor connected to a source of the second amplifier transistor.

22. An electronic circuit as defined in any one of claims 17 to 21 wherein the low pass filter includes an inductor disposed in the first radiofrequency path and a capacitor connecting the first radiofrequency path to ground and the high pass filter comprises a capacitor disposed in the second radiofrequency path and an inductor connecting the second radiofrequency path to ground.

23. An electronic circuit as defined in claim 22 wherein the low pass filter includes a first blocking capacitor disposed in the first radiofrequency path and the high pass filter includes a second blocking capacitor disposed in series with the inductor.

24. A storage medium having stored therein executable commands for execution on a processor, the executable commands for when executed resulting in an electronic circuit design comprising:
    an input port for receiving a radiofrequency signal, the radiofrequency signal being in one of a first frequency range and a second frequency range, the first frequency range including frequencies higher than the frequencies of the second frequency range;
    a first amplifier transistor for generating a first output signal in dependence upon the radiofrequency signal when the radiofrequency signal is in the first frequency range, the first amplifier transistor having a first input impedance, the first input impedance being sufficient for reflecting the radiofrequency signal in the second frequency range;
    a second amplifier transistor for generating a second output signal in dependence upon the radiofrequency signal when the radiofrequency signal is in the second frequency range, the second amplifier transistor having a second input impedance, the second input impedance being sufficient for reflecting the radiofrequency signal in the first frequency range;
    a low pass filter disposed in a first radiofrequency path between the input port and a control terminal of the first amplifier transistor, the low pass filter having a predetermined first low pass filter reactance in the first frequency range for matching the first input impedance to a predetermined input port impedance and a predetermined second low pass filter reactance in the second frequency range for transmitting the first input impedance to the input port; and,
    a high pass filter disposed in a second radiofrequency path between the input port and a control terminal of the second amplifier transistor, the high pass filter having a predetermined first high pass filter reactance in the first frequency range for transmitting the second input impedance to the input port and a predetermined second high pass filter reactance in the second frequency range for matching the second input impedance to the input port impedance.

25. A method comprising:
    receiving a control signal indicative of a radiofrequency signal being in one of a first frequency range and a second frequency range;
    turning ON one of a first amplifier and a second amplifier in dependence upon the control signal;
    receiving the radiofrequency signal;
    if the radiofrequency signal is in the first frequency range, transforming a predetermined first input impedance of the first amplifier to match a predetermined impedance of an input port for receiving the radiofrequency signal and transmitting a predetermined second input impedance of the second amplifier to the input port;

if the radiofrequency signal is in the second frequency range, transforming the second input impedance of the second amplifier to match the impedance of the input port and transmitting the first input impedance of the first amplifier to the input port; and, processing the radiofrequency signal using the turned ON one of the first amplifier and the second amplifier.

26. A method as defined in claim 25 wherein the first frequency range includes frequencies higher than the frequencies of the second frequency range the first input impedance is one of transformed and transmitted using a low pass filter disposed in a first radiofrequency path connecting the input port with the first amplifier, and the second input impedance is the other one of transformed and transmitted using a high pass filter disposed in a second radiofrequency path connecting the input port with the second amplifier.

27. A method as defined in claim 26 wherein the first amplifier and the second amplifier includes a first amplifier transistor and a second amplifier transistor, respectively, a source of the first amplifier transistor and the second amplifier transistor being connected to a first source switch transistor and a second source switch transistor, respectively.

28. A method as defined in claim 27 further comprising turning OFF the one of the first source switch transistor and the second source switch transistor followed by turning OFF the respective amplifier transistor.

29. The method according to claim 27 further comprising turning ON one of the first source switch transistor and the second source switch transistor in dependence upon the control signal prior to turning ON the one of the first amplifier and the second amplifier.

30. A method as defined in claim 26 wherein the first amplifier and the second amplifier include a first amplifier transistor and a second amplifier transistor, respectively, and the method further comprises turning ON in dependence upon the control signal one of a first bias circuit and a second bias circuit connected to the first radiofrequency path and the second radiofrequency path, respectively.

* * * * *

UNITED STATES PATENT AND TRADEMARK OFFICE
CERTIFICATE OF CORRECTION

PATENT NO. : 8,271,028 B2  
APPLICATION NO. : 12/490638  
DATED : September 18, 2012  
INVENTOR(S) : Rabjohn Page 1 of 1

It is certified that error appears in the above-identified patent and that said Letters Patent is hereby corrected as shown below:

In the Claims:

In column 9 at line 5, In Claim 14, change "cascade" to --cascode--.

Signed and Sealed this
Fourteenth Day of May, 2013

Teresa Stanek Rea
*Acting Director of the United States Patent and Trademark Office*